United States Patent
Mergenthaler et al.

(10) Patent No.: US 11,641,785 B2
(45) Date of Patent: May 2, 2023

(54) ION MILLING FOR FREQUENCY TUNING OF SUPERCONDUCTING QUBITS

(71) Applicant: INTERNATIONAL BUSINESS MACHINES CORPORATION, Armonk, NY (US)

(72) Inventors: Matthias Mergenthaler, Zurich (CH); Andreas Fuhrer Janett, Zurich (CH); Stephan Paredes, Zurich (CH); Peter Mueller, Rueschlikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 219 days.

(21) Appl. No.: 17/063,907

(22) Filed: Oct. 6, 2020

(65) Prior Publication Data
US 2022/0109095 A1    Apr. 7, 2022

(51) Int. Cl.
*G06N 10/00*    (2022.01)
*H01L 39/22*    (2006.01)

(52) U.S. Cl.
CPC ........... *H01L 39/223* (2013.01); *G06N 10/00* (2019.01)

(58) Field of Classification Search
CPC .... H01L 39/223; H01L 39/2493; G06N 10/00
See application file for complete search history.

(56) References Cited

U.S. PATENT DOCUMENTS

| 4,490,901 | A  | 1/1985 | Clark et al. |
| 6,051,440 | A  | 4/2000 | Chan et al. |
| 6,347,237 | B1 | 2/2002 | Eden et al. |
| 10,224,475 | B2 | 3/2019 | Cybart et al. |
| 2019/0042967 | A1 | 2/2019 | Yoscovits et al. |
| 2019/0165244 | A1 | 5/2019 | Hertzberg et al. |
| 2019/0273196 | A1 | 9/2019 | Marcus et al. |
| 2020/0287121 | A1 | 9/2020 | Stoeferle et al. |

FOREIGN PATENT DOCUMENTS

WO    2018160187 A1    9/2018

OTHER PUBLICATIONS

DeLuca et al., "Automatic Trimming of Josephson Devices", IBM TDB 03-83 p. 5077, IPCOM000045354D, Feb. 6, 2005.
Cox et al., "Focused Ion Beam Processing of Superconducting Junctions and SQUID Based Devices", Nanofabrication, vol. 1, 2014, pp. 53-64.
(Continued)

*Primary Examiner* — Matthew L Reames
(74) *Attorney, Agent, or Firm* — Amin, Turocy & Watson, LLP (57) ABSTRACT

A method of modifying a resonant frequency of a quantum device includes generating an ion beam having a beam energy and exposing a surface of the quantum device to the ion beam for an exposure time. The ion beam is incident onto the quantum device at an oblique angle that is less than 90 degrees as measured from the surface of the quantum device. The quantum device includes a Josephson junction, the ion beam exposing the quantum device proximate to the Josephson junction to modify a property of the Josephson junction, the property being associated with the resonant frequency of the quantum device.

20 Claims, 8 Drawing Sheets

(56) References Cited

OTHER PUBLICATIONS

Enderling et al., "Characterization of frequency tuning using focused ion beam platinum deposition", Journal of Micromechanics and Microengineering, vol. 17, 2007, pp. 213-219.
Bal et al., "Frequency trimming of superconducting fixed-frequency qubits", APS March Meeting, 2019, 1 page.
Muthusubramanian et al., "Local trimming of transmon qubit frequency by laser annealing of Josephson junctions", APS March Meeting, 2019, 1 page.

ION MILLING FOR FREQUENCY TUNING OF SUPERCONDUCTING QUBITS

BACKGROUND

The currently claimed embodiments of the present invention relate to modifying the frequency of a quantum device, and more specifically, to frequency tuning for superconducting qubits that include a Josephson junction.

Some quantum computing devices are based on superconducting qubits. Such superconducting qubits are often superconducting oscillator circuits that have quantized oscillation states. The difference in frequency between the lowest oscillation state of the circuit and the next higher oscillation state is referred to as the frequency of the superconducting qubit. It is an excitation frequency, related to excitation energy, of the circuit. Many superconducting qubits have one or more Josephson junctions as part of their circuits. The specific structures of the Josephson junctions within the circuits are related to the frequency of the superconducting qubit. Some embodiments of the current invention are related to frequency tuning superconducting qubits that include at least one Josephson junction.

Deployment of quantum devices with Josephson junctions, such as transmission line shunted plasma oscillation ("transmon") qubit chips for quantum computation applications, requires strict margins for the frequency detuning between qubit pairs. It is desirable to produce superconducting qubit resonators with a precise, preset resonance frequency. However, statistical variations in the fabrication of Josephson junctions (e.g., imperfections in the fabrication and the materials) lead to systematic and non-systematic deviations from the intended resonance frequency. So-called fixed frequency qubits have no means of compensating for these deviations. When scaling up the number of transmon qubits in a quantum computing system, the effect of unavoidable statistical fabrication variance of the resonance frequencies becomes particularly pronounced, increases unwanted coupling between different qubits, and puts constraints on the frequency detuning of coupled qubits. A number of multi-qubit chips have to be screened in order to find desirable detunings and avoid frequency collisions. The more coupled qubits on one chip, the more chips have to be screened. In-situ frequency tuning of the qubits is also desirable in order to reach a faster turn-around in achieving the desired frequency de-tunings and reducing frequency collisions. The same considerations apply to other types of quantum devices that include Josephson junctions, such as amplifiers, filters, and resonators.

Frequency tunable transmon qubits, such as the ones presented in this study, are used to adjust the frequency de-tuning during operation. Nevertheless, these types of transmon qubits suffer from low coherence times due to their susceptibility to flux noise. Hence, fixed frequency transmon qubits are desirable, however their qubit frequency needs to be adjusted externally. Post-fabrication trimming of fixed frequency transmon qubits to achieve the desired individual resonance frequencies could alleviate these problems.

To date, post fabrication frequency trimming of fixed frequency transmon qubits has only been shown with local laser annealing of the Josephson junction. This reduces the qubit frequency but can also deposit dirt on the chip surfaces. Some embodiments of the invention provide a method for in-situ qubit frequency tuning with ion milling, which not only tunes the qubit frequency post fabrication, but also in some embodiments cleans the surfaces of the circuits from contamination.

SUMMARY

An embodiment of the present invention relates to a method for modifying a resonant frequency of a quantum device that includes a Josephson junction. The method generates an ion beam having a beam energy. The method exposes a surface of the quantum device to the ion beam for an exposure time. The ion beam is incident onto the quantum device at an oblique angle that is less than 90 degrees as measured from the surface of the quantum device. The quantum device includes a Josephson junction. The ion beam exposes the quantum device proximate to the Josephson junction to modify a property of the Josephson junction, the property being associated with the resonant frequency of the quantum device.

Another embodiment of the present invention relates to a quantum device that includes a Josephson junction and a surface, the surface having been exposed to an ion beam having a beam energy for an exposure time and modified by the ion beam. The ion beam was incident onto the quantum device at an oblique angle that was less than 90 degrees as measured from the surface of the quantum device. The ion beam exposed the surface of the quantum device proximate to the Josephson junction to modify a property of the Josephson junction, the property being associated with a resonant frequency of the quantum device.

BRIEF DESCRIPTION OF THE DRAWINGS

Embodiments of the present invention, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed, and other methods developed without departing from the broad concepts of the current invention.

Deployment of quantum devices with Josephson junctions, such as transmission line shunted plasma oscillation ("transmon") qubit chips for quantum computation applications, requires strict margins for the frequency detuning between qubit pairs. It is desirable to produce superconducting qubit resonators with a precise, preset resonance frequency. However, statistical variations in the fabrication of Josephson junctions (e.g., imperfections in the fabrication and the materials) lead to systematic and non-systematic deviations from the intended resonance frequency. So-called fixed frequency qubits have no means of compensating for these deviations. When scaling up the number of transmon qubits in a quantum computing system, the effect of unavoidable statistical fabrication variance of the resonance frequencies becomes particularly pronounced, increases unwanted coupling between different qubits, and puts constraints on the frequency detuning of coupled qubits. A number of multi-qubit chips have to be screened in order to find desirable detunings and avoid frequency collisions. The more coupled qubits on one chip, the more chips have to be screened. In-situ frequency tuning of the qubits is also desirable in order to reach a faster turn-around in achieving the desired frequency de-tunings and reducing frequency collisions. The same considerations apply to other types of quantum devices that include Josephson junctions, such as amplifiers, filters, and resonators.

Frequency tunable transmon qubits, such as the ones presented in this study, are used to adjust the frequency de-tuning during operation. Nevertheless, these types of transmon qubits suffer from low coherence times due to their susceptibility to flux noise. Hence, fixed frequency transmon qubits are desirable, however their qubit frequency needs to be adjusted externally. Post-fabrication trimming of fixed frequency transmon qubits to achieve the desired individual resonance frequencies could alleviate these problems.

To date, post fabrication frequency trimming of fixed frequency transmon qubits has only been shown with local laser annealing of the Josephson junction. This reduces the qubit frequency but can also deposit dirt on the chip surfaces. Some embodiments of the invention provide a method for in-situ qubit frequency tuning with ion milling, which not only tunes the qubit frequency post fabrication, but also in some embodiments cleans the surfaces of the circuits from contamination.

The embodiments of the invention discussed below refer primarily to transmon qubits. However, other embodiments of the invention pertain to any quantum device that includes a Josephson junction, including but not limited to amplifiers, filters, and resonators. Some embodiments of the invention pertain to multiple quantum devices (e.g., transmon qubits) on a single chip or other form of packaging.

Some embodiments of the invention provide various advantages over other frequency tuning techniques. For example, in embodiments with a focused ion beam, there is localized ion exposure of the chip and hence very local frequency tuning. In addition, some embodiments are non-invasive, i.e. have no clear reduction in $T_1$ for frequency tuning with certain ions such as $SF_6$. Furthermore, some embodiments of the invention are compatible to any stage of the fabrication procedure as well as the fully packaged chip assembly if the qubit plane is accessible. In some embodiments, ion milling has no direct impact on anharmonicity of qubits. In some embodiments, ion milling cleans the surfaces from fabrication residue and contaminants. In some embodiments, depending on ion species, a beneficial surface passivation layer is provided.

Some embodiments of the invention describe in-situ frequency tuning of superconducting qubits incorporating a Josephson junction, by exposing the qubit/Josephson junction to an ion beam of a certain ion species with tunable ion energy. At least one of the ion species, the ion energy, the duration of the ion exposure (i.e. ion dose), and the angle of the incident ion beam with respect to the surface of the Josephson junction are varied in different embodiments to determine the amount of frequency tuning.

Figure 1A:
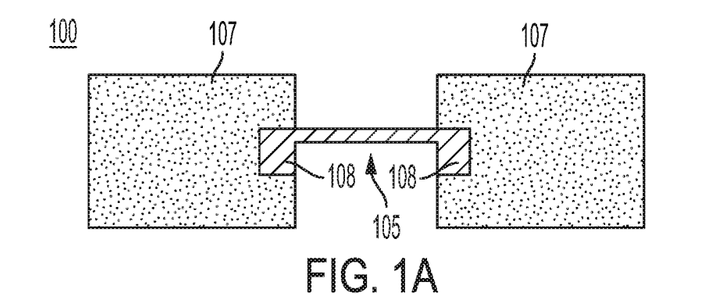
FIGS. 1A-1C are different views of a schematic illustration of a quantum device with a Josephson junction, that is exposed to an incident ion beam according to an embodiment of the current invention.
Figure 1B:
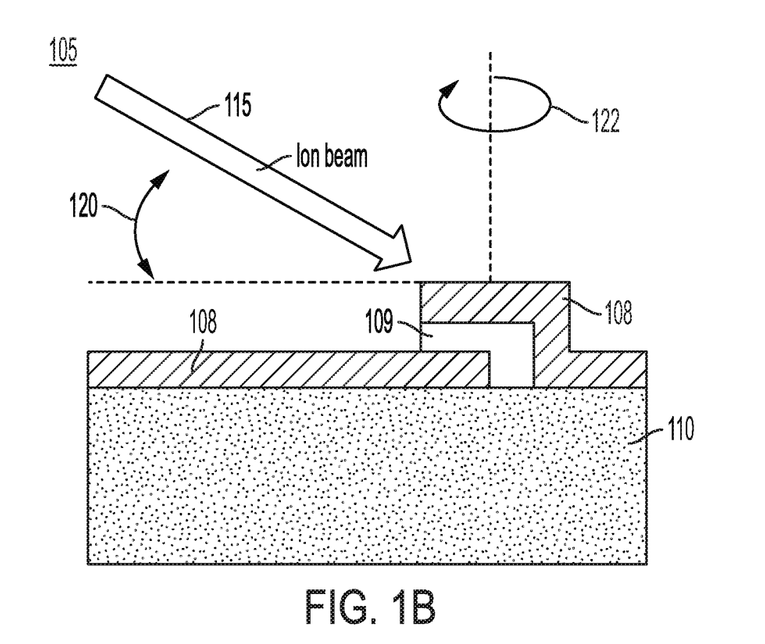
Figure 1C:
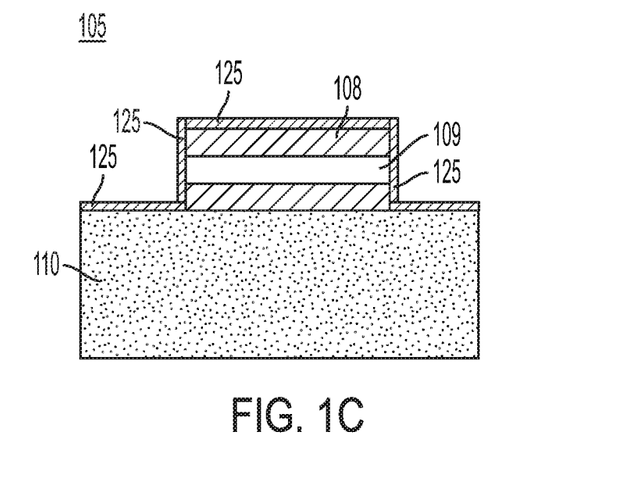

FIGS. 1A-1C schematically illustrate an example of a quantum device 100 with a Josephson junction 105. Examples of such devices include transmon qubits, amplifiers, filters, and resonators. The quantum device 100 has superconducting leads 107, which in some embodiments is made of a superconducting metal (e.g., niobium), which act as capacitor pads for the qubit resonance circuit. The top view (FIG. 1A) illustrates the superconducting leads 107 and the Josephson junction 105, which in some embodiments is made of a superconducting material 108 such as aluminum (Al), with aluminum oxide ($Al_2O_3$) as an insulator 109.

The quantum device 100 also includes a substrate 110, illustrated in the side view (FIG. 1B), which in some embodiments is made of semiconducting (e.g., silicon) and/or insulating (e.g., sapphire) material. The term "substrate" is a monolithic structure in some embodiments, or in other embodiments a structure that may include multiple layers of material, including patterned layers.

The side view (FIG. 1B) also illustrates exposing the quantum device 100 to an ion beam 115. The ion beam 115 is incident on the Josephson junction 105 at an oblique, shallow angle 120, as measured from the surface. The oblique angle is 30 degrees, plus or minus 5 degrees, in some embodiments. As indicated by the circular arrow 122, the ion beam may be incident upon the surface at the angle 120 from any direction. The ion beam 115 impacts the surface of the Josephson junction 105, resulting in physical milling (removal) of material (e.g., removal of Al or $Al_2O_3$).

Figure 1D:
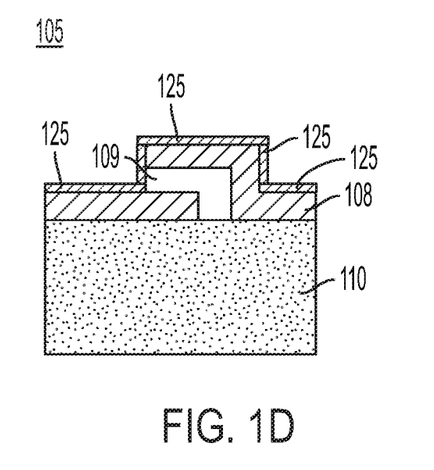

The cross-section view (FIG. 1C) and side view (FIG. 1D) illustrate the quantum device 100 after ion milling with the ion beam 115. In some embodiments, the ion species of the ion beam 115 is chosen to result in chemical milling as well as physical milling, in which the ions chemically react with at least one of the material surfaces of the Josephson junction 105 or the substrate surface to create a passivation layer 125. These material surfaces include the sidewalls and substrate in some embodiments, both near to and further from the Josephson junction. In some embodiments the passivation layer 125 prevents the creation or physiosorption of defects or defect containing materials (such as surface oxides) near or directly on the junction. This passivation layer 125 may have a positive impact on qubit coherence.

Figure 2:
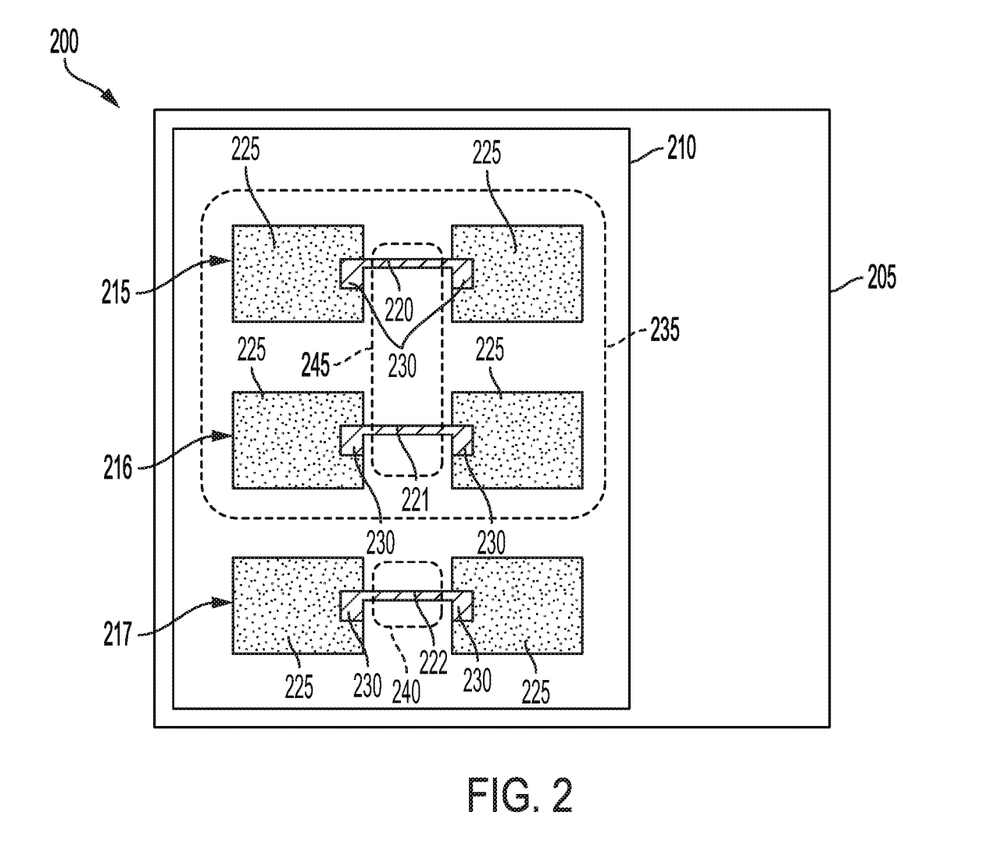
FIG. 2 is a schematic diagram of a superconducting quantum computer system, according to an embodiment of the present invention.

FIG. 2 is a schematic diagram (top view) of a superconducting quantum computer system 200, according to an embodiment of the present invention. The superconducting quantum computer system 200 includes a refrigeration system comprising a temperature-controlled vessel 205. The superconducting quantum computer 200 also includes a quantum processor 210 disposed within the temperature-controlled vessel 205. The quantum processor 210, also referred to in some embodiments as a qubit chip, includes multiple quantum devices (in this example, qubits) 215-217, each with its own Josephson junction 220-222. However, the general concepts of this invention are not limited to qubits or quantum devices that have only one Josephson junction. In some embodiments, one or more of the qubits can have two or more Josephson junctions, for example. In some embodiments, a quantum processor includes a qubit chip in a layer with an ancillary qubit chip, and an interposer chip between them, for error correction and for addressing the qubits.

In an embodiment, without limitation, the qubit can be a superconducting circuit that has a Josephson junction shunted by a capacitor. Each qubit 215-217 includes multiple leads formed on top of the qubit chip substrate, which are constructed to carry a supercurrent while in use. In some embodiments, each qubit 215-217 includes at least a pair of niobium leads 225 and a pair of aluminum leads 230, where each aluminum lead is partially in contact with a niobium lead, and the two aluminum leads have a quantum tunneling barrier therebetween to form the Josephson junction for that qubit.

Depending on the focus area of the ion beam 115, one or more of the qubits 215 can be tuned in frequency. For example, multiple qubits on a single quantum processor 210 are simultaneously exposed to an ion beam 115 in some embodiments, as indicated by the dotted line 235 in FIG. 2, which represents the focus area of an ion beam that is incident upon qubits 215 and 216 (which are a subset of the qubits 215-217 present on quantum processor 210). In some embodiments, individual junctions/qubits are exposed to a focused ion beam 115, as indicated by the dotted line 240 in FIG. 2, which represents the focus area of an ion beam that is incident upon the Josephson junction 222 of qubit 217.

In some embodiments, the ion beam 115 is focused to a small region of the quantum processor 210 in order to selectively expose a subset of the junctions/qubits. For example, dotted line 245 represents the focus area of an ion beam that is selectively incident on portions of qubits 215 and 216 (i.e., the Josephson junctions 220 and 221) while leaving other portions of qubits 215 and 216 unexposed, as well as leaving the entirety of qubit 217 unexposed. The ion beam 115 is moved in some embodiments to expose other portions of the quantum processor 210. In other embodiments, the ion beam 115 is held stationary and the quantum processor 210 is moved.

For quantum devices 100 comprising Josephson junctions 105 (e.g. transmon qubits, and other superconducting qubits or quantum devices 100 based on $Al/Al_2O_3$ Josephson junctions), trimming of the resonance frequency is achieved in some embodiments by using an ion beam 115 to increase the resistance of the Josephson junction 105. The Josephson junction 105 is exposed to the ion beam 115, and through ion milling with the ion beam, the surfaces and edges are processed (material removal referred to as physical milling) resulting in an increased junction resistance. Examples of ion species that are used for physical milling in some embodiments include neon (Ne) and argon (Ar).

It is also possible in some embodiments to choose a gas as ion source which in addition to physical milling, exhibits a chemical interaction (referred to as chemical milling) of the gas with the material surfaces. Examples of ion species that are used for chemical milling in some embodiments include ion fragments of one of sulfur hexafluoride ($SF_6$) of $SF_x$ (x=0-6), ion fragments of tetrafluoromethane ($CF_4$) of $CF_y$ (y =0-4), hydrogen bromide (HBr), and chlorine ($Cl_2$). Some of these ion fragments can create a passivation layer 125, which is left after the frequency tuning process comprising chemical milling. In some embodiments this passivation layer 125 may be beneficial for the coherence time of the qubit.

In embodiments where the ion beam 115 is focused, a subset of the qubits (e.g., qubits 215 and 216) are treated with an ion beam (e.g., with focus area 235) to have a passivation layer 125, whereas other qubits on the same chip are left unexposed or exposed with different ion beam characteristics (varying one or more of ion species, duration, ion source distance, incidence angle 120, beam energy, etc.) in order to not have a surface passivation layer 125 or have a different passivation layer 125 (e.g., of different thickness, chemical composition, etc.).

In some embodiments of the invention, the devices are mounted in an ultra-high vacuum (UHV) chamber and qubit frequency trimming is performed with different ion milling conditions. The ion beam 115 is incident on the sample under a shallow angle 120 (as measured from the surface) and the acceleration voltage $U_{acc}$, exposure duration t, and sample-source distance are varied. After the ion beam 115 exposure, in some embodiments the quantum devices 100 are packaged under UHV and transferred to a dilution refrigerator for measurements.

The acceleration voltage $U_{acc}$ varies in some embodiments in a range from 0.1 to 10 kiloelectron volts (keV). In some embodiments, lower energies result in less physical milling and higher energies result in more physical milling. However, in some embodiments lower energies also produce less ion implantation and thus less damage and defects.

The angle of incidence 120 of the ion beam 115 is oblique in some embodiments to optimize physical and chemical milling without impinging deeply into the surface. A shallow angle of ~60° as measured from normal (perpendicular) incidence is used in some embodiments, corresponding to an angle of ~30° as measured from the surface. The angle of incidence 120 varies in some embodiments by 5-20 degrees above or below this oblique angle, depending on other factors such as ion species and energy. Note that beams with high angles of incidence 120 (e.g., close to perpendicular incidence upon the surface) are less likely to result in milling and more likely to result in implantation of the ion particles into the surface. In some embodiments, use of shallow angles of incidence 120 results in the surface being substantially free of ions from the ion beam 115 at depths of 10 nanometers (nm) or more into the bulk of the device beyond the surface layer.

As discussed above, some embodiments tune the frequency by using ion milling to modify the normal state resistance of resistance $R_n$ of the Josephson junction 105. To investigate frequency tuning with ion-milling, the effect of the ion beam exposure on the normal state resistance $R_n$ of Josephson junctions 105 was studied. The resistance of an array of 270 junctions 105 was measured at room temperature directly after ion milling (without UHV packaging). The junction array was fabricated in the same batch as the qubits described below. The change in $R_n$ under different ion beam exposures listed in Table I is presented in FIG. 3. For example, Ne ion exposure with $U_{acc}$=0.75 kV (i) changed $R_n$ on average by roughly $\Delta R_n$=285 Ω. Increasing the acceleration voltage to $U_{acc}$=1.0 kV (ii) also increased $\Delta R_n$ to 520 Ω. Further increasing $U_{acc}$ to 1.25 kV (iii), resulted in a mean change of $\Delta R_n$=718 Ω.

Figure 3:
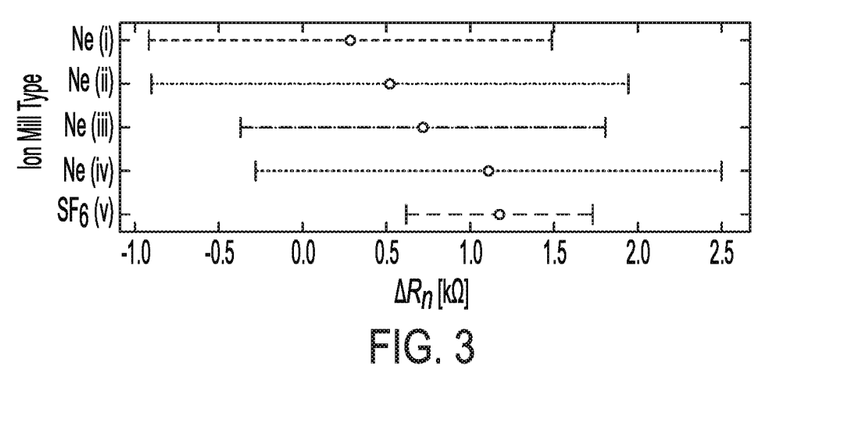
FIG. 3 illustrates the change in normal state resistance $R_n$ of Josephson junctions treated with ion milling, according to an embodiment of the present invention.

The strength of tuning $\Delta R_n$ is varied in some embodiments by increasing $U_{acc}$, and on other embodiments by prolongation of the ion beam exposure time. For example, doubling the ion beam exposure time to 40 min while keeping $U_{acc}$=1.25 kV (iv) led to an almost two-fold increase of $R_n$=1.110 kΩ. The junction array was also exposed to an $SF_6$ ion beam, which resulted in $\Delta R_n$=1.28 kΩ. The change in resistance is attributed to the change in effective junction area due to material (capping oxide, Al and oxide) removal around the edges and on the surface. Higher acceleration voltages, i.e. larger ion energies, resulted in stronger material removal, which is consistent with the observed increase in $\Delta R_n$.

Figure 4:
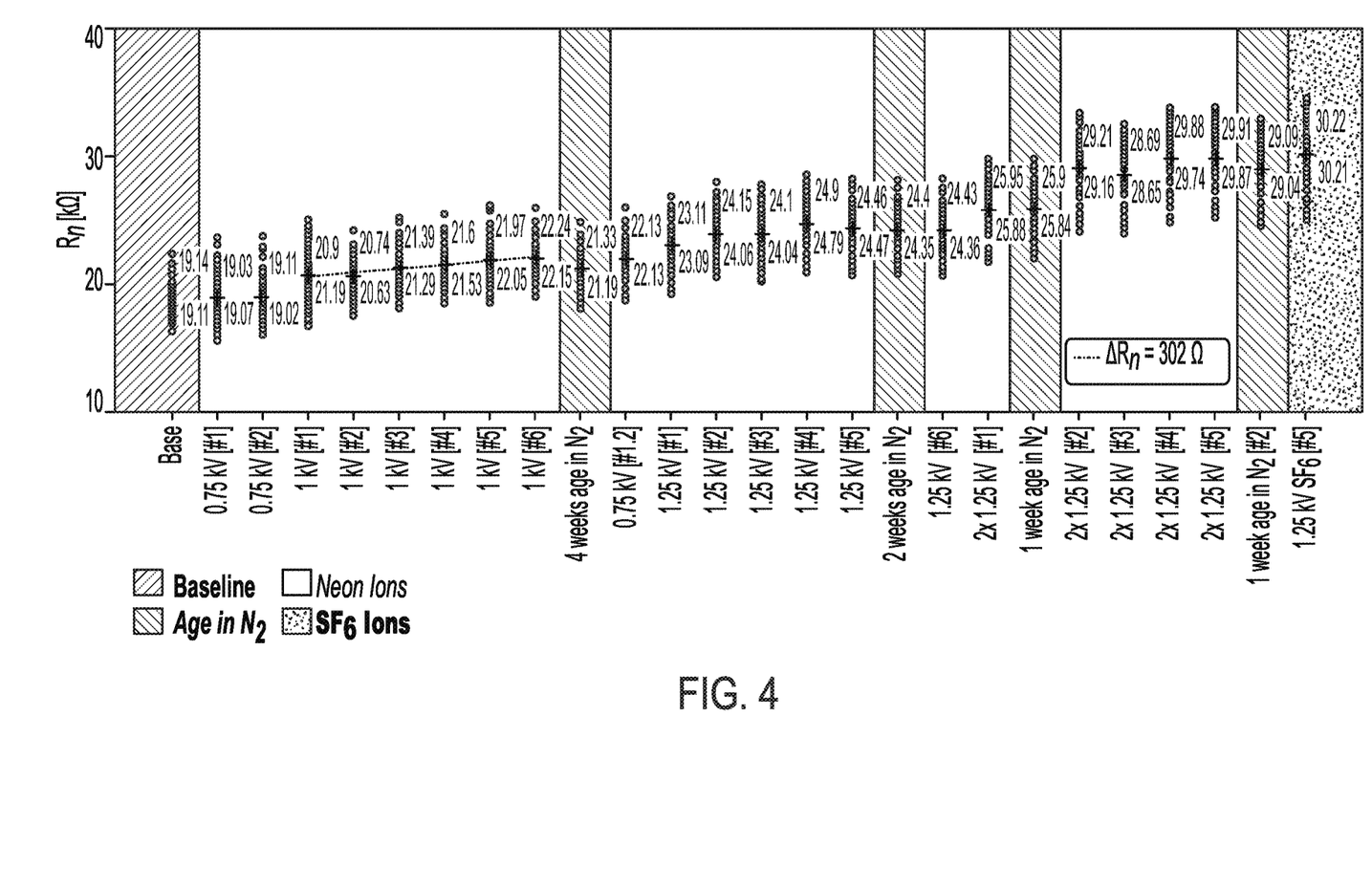
FIG. 4 illustrates the dependence of Josephson junction resistance as a function of ion milling parameters and ion type, according to an embodiment of the present invention.

The dependence of Josephson junction 105 resistance as a function of ion milling parameters and ion type is further illustrated in FIG. 4. The array of 270 Josephson junctions 105 was exposed to either Ne/SF$_6$ ions from a beam with fixed ion-current and ion-energy. Chamber was previously pumped to UHV (<10e$^{-9}$). Varying the ion beam energy from 0.75 kV to 1.25 kV allowed for controllably tuning the normal state resistance ($R_n$) of the Josephson junction 105. The normal state resistance of Josephson junction 105 was inversely proportional to the Josephson energy which directly impacted the qubit frequency, as discussed below. With 1 kV ion energy of neon ions and a milling time of 20 minutes, the junction resistance could be tuned in steps of ~300 Ω (dashed line, FIG. 4).

Figure 5A:
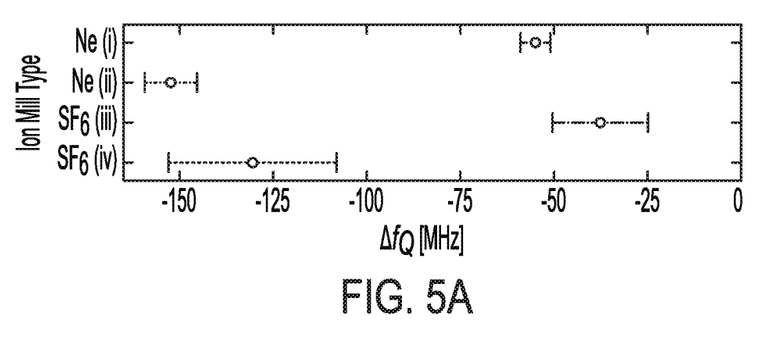
FIGS. 5A-5B illustrate changes in qubit parameters during qubit frequency tuning with ion milling, according to an embodiment of the present invention.
Figure 5B:
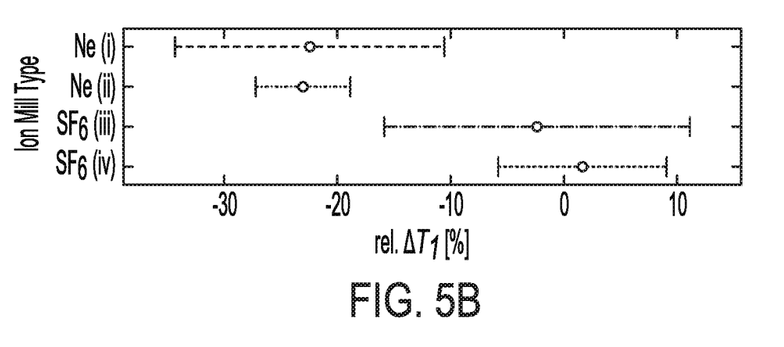

The change in $R_n$ of the Josephson junctions 105 due to the ion beam exposure is utilized in some embodiments to tune the frequency of transmon qubits, since $f_Q \propto \sqrt{E_J} \propto I_c \propto 1/R_n$. Since ion milling, i.e. material removal, leads to an increase in Josephson junction 105 resistance, it will therefore result in a decrease in transmon qubit frequency. FIGS. 5A and 5B summarize the effect of frequency tuning by ion milling on transmon qubits and the effects on the qubit relaxation time $T_1$.

TABLE I

Table of ion milling conditions for Josephson junction tuning.

|  | Gas | P [mBar] | $U_{acc}$ [kV] | t [min] | $I_{ion}$ [nA] |
|---|---|---|---|---|---|
| (i) | Ne | 1.0e$^{-4}$ | 0.75 | 20 | ~45 |
| (ii) | Ne | 1.0e$^{-4}$ | 1.0 | 20 | ~46 |
| (iii) | Ne | 1.0e$^{-4}$ | 1.25 | 20 | ~47 |
| (iv) | Ne | 1.0e$^{-4}$ | 1.25 | 40 | ~47 |
| (v) | SF$_6$ | 1.0e$^{-4}$ | 1.25 | 20 | ~42 |

Frequency tuning was performed on flux tunable transmon qubits, and the qubit frequency is defined by the maximum of the fit to frequency vs. external flux, i.e. the frequency at the sweet spot of the qubit. The change in qubit frequency $\Delta f_Q$ due to the different ion milling conditions listed in Table II is presented in FIG. 5A. Ion milling with Ne ions exhibiting a low energy (i) resulted in an average qubit frequency change of −55 MHz. However, increasing the ion energy of the Ne ions and doubling the ion exposure time (ii) increased the frequency tuning 3-fold to $\Delta f_Q$=152 MHz. Replacing the Ne ions with SF6 ions (iii) softened the frequency tuning to $\Delta f_Q$=38 MHz. Adjusting the distance between the ion source and the qubit plane by a few mm (iv) resulted in a 3-fold increase in the frequency tuning, i.e. $\Delta f_Q$=131 MHz. Similar to the observation with the junction array, ion milling of the qubit junctions leads to a small amount of material removal around the edges. The change in effective junction area is roughly consistent with the change in qubit frequency. Similar to the process with the junction array, the ion exposure dose is also varied in some embodiments by changing the distance between the qubit plane and the ion source due to beam focusing and beam collimation. This is attributed to the higher $\Delta f_Q$ observed for qubits tuned with SF$_6$ ion milling condition (iv).

Having shown control of the frequency tuning by ion milling, it is important to sustain good coherence of the qubits following the tuning. Here, the relative change in $T_1$ of the qubits after the tuning process was also investigated. As illustrated in FIG. 5B, frequency tuning with Ne ions had a strong impact on $T_1$ of the qubits. The average relative change of $T_1$ for both parameter conditions of frequency tuning with Ne ions, (i) & (ii), is $\Delta T_1$~−23%. In contrast, frequency tuning with SF$_6$ ions, (iii) & (iv), leads to almost no significant relative change of $T_1$, averaged over both tuning conditions. The statistical variations for the measured $T_1$ times for all qubit frequency tuning conditions are attributed to cooldown to cooldown variations and $T_1$ fluctuations. The data suggests that Ne ions had a negative impact on the qubit coherence, whereas SF$_6$ ions seemed to have no impact on the coherence, as also shown before. This could be attributed to the difference in size between the Ne and SF$_6$ ions. Therefore, it is evident that for qubit frequency tuning by ion milling, the ion species has to be chosen carefully. These results demonstrate that ion milling with SF$_6$ ions did not impact the figures of merit of fixed frequency qubits, i.e. $T_1$ and $T_2^{echo}$. Hence, ion milling presents an effective method for in situ post-fabrication frequency tuning of fixed frequency transmon qubits in some embodiments.

TABLE II

Table of ion milling conditions for qubit frequency tuning.

|  | Gas | $U_{acc}$ [kV] | t [min] | $I_{ion}$ [nA] | Details |
|---|---|---|---|---|---|
| (i) | Ne | 0.75 | 20 | ~45 | — |
| (ii) | Ne | 1.25 | 40 | ~47 | NH3 passivation |
| (iii) | SF6 | 1.25 | 20 | ~42 | — |
| (iv) | SF6 | 1.25 | 20 | — | closer to source |

Figure 6:
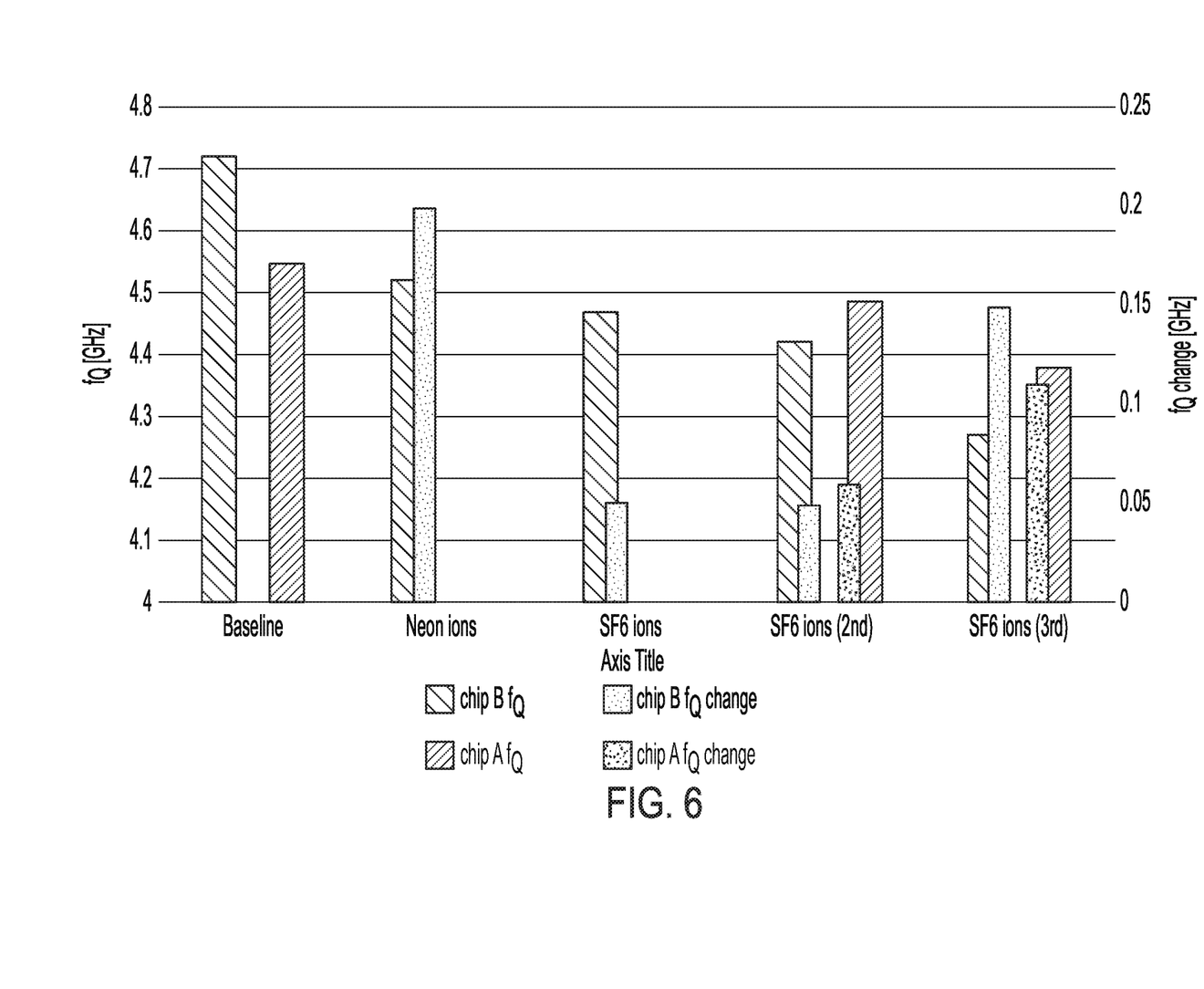
FIG. 6 illustrates frequency tuning of transmon qubits with varying ion species, milling time, and distance to source, according to an embodiment of the present invention.

FIG. 6 further illustrates frequency tuning of transmon qubits with varying ion species, milling time (duration, also referred to as dose), and distance to source. Four flux-tunable transmon qubits on 2 chips (8 qubits total) were exposed to two different ion beam prescriptions. The baseline frequency for each chip was defined as the maximum qubit frequency determined right after fabrication. The first chip (chip A) was exposed twice, first to SF$_6$ ions (1.25 kV ion energy, 20 min) and then to SF$_6$ ions (1.25 kV ion energy, 20 min) while varying the distance to ion source. The second chip (chip B) was exposed four times, first to neon ions (1.25 kV ion energy, 40 min), then second and third exposures to SF$_6$ ions (1.25 kV ion energy, 20 min), and then a fourth exposure to SF$_6$ ions (1.25 kV ion energy, 20 min) while varying the distance to ion source.

In FIG. 6, the shaded bars indicate the qubit frequencies (left axis) and the dotted bars indicate the change in frequency (right axis). The results are presented in Table III and demonstrate that qubit frequencies are controllably trimmable with both ion species. Furthermore, the trimming strength varies with ion species, milling time, and distance to source.

TABLE III

Table of varying qubit frequency tuning with ion species, milling time, and distance to source.

| | Baseline | Neon ions | $SF_6$ ions ($1^{st}$) | $SF_6$ ions ($2^{nd}$) | $SF_6$ ions ($3^{rd}$) |
|---|---|---|---|---|---|
| Chip A (4 qubit avg) | $f_Q$ ~4.55 GHz | — | — | $f_Q$ ~4.49 GHz (D = 0.06) | $f_Q$ ~4.38 GHz (D = 0.11) |
| Chip B (4 qubit avg) | $f_Q$ ~4.72 GHz | $f_Q$ ~4.52 GHz (D = 0.2) | $f_Q$ ~4.47 GHz (D = 0.05) | $f_Q$ ~4.42 GHz (D = 0.05) | $f_Q$ ~4.27 GHz (D = 0.15) |

The descriptions of the various embodiments of the present invention have been presented for the purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed therein.

The invention claimed is:

1. A method, comprising:
   modifying, using ion milling, a resonant frequency of a quantum device to a defined resonant frequency, the modifying comprising
      generating an ion beam having a beam energy selected for the ion milling; and
      exposing a surface of the quantum device to the ion beam for an exposure time, wherein the ion beam is incident onto the quantum device at an oblique angle that is 30 degrees, ±20 degrees as measured from the surface of the quantum device, and
      wherein the quantum device comprises a Josephson junction, and said ion beam having a focus area exposing the Josephson junction to modify a property of the Josephson junction, said property associated with the resonant frequency of the quantum device.

2. The method of claim 1, wherein the oblique angle is 30 degrees, ±5 degrees.

3. The method of claim 1, wherein the quantum device is at least one of an amplifier, a filter, a resonator, and a qubit.

4. The method of claim 1, wherein the quantum device is a qubit chip comprising a plurality of qubits, each qubit comprising a Josephson junction, and
   wherein the exposing simultaneously exposes the each said Josephson junction of the plurality of qubits to modify the property of each Josephson junction.

5. The method of claim 1 further comprising adjusting the focus area of the ion beam to a region smaller than a size of the surface of the quantum device,
   wherein exposing the surface comprises exposing a selected portion of the quantum device to the ion beam such that another portion of the quantum device remains unexposed to the ion beam.

6. The method of claim 5, further comprising at least one of directing the ion beam and moving the quantum device to selectively expose portions of the quantum device to the ion beam.

7. The method of claim 1, wherein the property of the Josephson junction is an electrical resistance of the Josephson junction, wherein the resonant frequency of the quantum device is modified by the ion beam increasing the electrical resistance of the Josephson junction.

8. The method of claim 1, wherein the beam energy is in a range from 0.1 to 10 kiloelectron volts (keV).

9. The method of claim 1, wherein the ion beam comprises at least one of neon ions and argon ions, wherein the ion beam modifies the property of the Josephson junction by physically removing material from the surface of the Josephson junction.

10. The method of claim 1, wherein the ion beam comprises ion fragments of at least one of sulfur hexafluoride (SF6) of SFx (x=0-6), tetrafluoromethane (CF4) of CFy (y=0-4), hydrogen bromide (HBr), or Chlorine (Ch), wherein the ion beam modifies the property of the Josephson junction at least by chemical milling comprising the ion fragments chemically reacting with a material of the surface of the Josephson junction.

11. The method of claim 10, wherein the chemical milling further modifies the quantum device to leave a passivation surface layer on at least a portion of quantum device resulting from the ion fragments chemically reacting with the material.

12. A method, comprising:
   modifying, using ion milling, a resonant frequency of a transmon qubit device to a defined resonant frequency, the modifying comprising
      generating an ion beam having a beam energy selected for the ion milling; and
      exposing a surface of the transmon qubit device to the ion beam for an exposure time,
      wherein the ion beam is incident onto the transmon qubit device at an oblique angle that is 30 degrees, ±20 degrees as measured from the surface of the transmon qubit device, and
      wherein the transmon qubit device comprises a Josephson junction, and said ion beam having a focus area exposing the Josephson junction to modify a property of the Josephson junction, said property associated with the resonant frequency of the transmon qubit device.

13. The method of claim 12, wherein the oblique angle is 30 degrees, ±5 degrees.

14. The method of claim 12, wherein the transmon qubit device comprises a plurality of qubits, each qubit comprising a Josephson junction, and
   wherein the exposing simultaneously exposes the each said Josephson junction of the plurality of qubits to modify the property of each Josephson junction.

15. The method of claim 12, further comprising adjusting the focus area of the ion beam to a region smaller than a size of the surface of the transmon qubit device,
   wherein exposing the surface comprises exposing a selected portion of the transmon qubit device to the ion beam such that another portion of the transmon qubit device remains unexposed to the ion beam.

16. The method of claim 15, further comprising at least one of directing the ion beam and moving the transmon qubit device to selectively expose portions of the transmon qubit device to the ion beam.

17. The method of claim 12, wherein the property of the Josephson junction is an electrical resistance of the Josephson junction, wherein the resonant frequency of the transmon qubit device is modified by the ion beam increasing the electrical resistance of the Josephson junction.

18. The method of claim 12, wherein the beam energy is in a range from 0.1 to 10 kiloelectron volts (keV).

19. The method of claim 12, wherein the ion beam comprises at least one of neon ions and argon ions, wherein the ion beam modifies the property of the Josephson junction by physically removing material from the surface of the Josephson junction.

20. The method of claim 12, wherein the ion beam comprises ion fragments of at least one of sulfur hexafluoride ($SF_6$) of $SF_x$ (x=0-6), tetrafluoromethane ($CF_4$) of $CF_y$ (y=0-4), hydrogen bromide (HBr), or Chlorine (Ch), wherein the ion beam modifies the property of the Josephson junction at least by chemical milling comprising the ion fragments chemically reacting with a material of the surface of the Josephson junction.

* * * * *